United States Patent
Baumgartl et al.

(10) Patent No.: US 9,417,303 B2
(45) Date of Patent: Aug. 16, 2016

(54) DIGITAL AMPLITUDE CONTROL AND DIGITAL PHASE CONTROL OF A HIGH-FREQUENCY SIGNAL

(71) Applicants: Rudi Baumgartl, Erlangen (DE); Nikolaus Demharter, Dormitz (DE)

(72) Inventors: Rudi Baumgartl, Erlangen (DE); Nikolaus Demharter, Dormitz (DE)

(73) Assignee: Siemens Aktiengesellschaft, München (DE)

( * ) Notice: Subject to any disclaimer, the term of this patent is extended or adjusted under 35 U.S.C. 154(b) by 864 days.

(21) Appl. No.: 13/760,798

(22) Filed: Feb. 6, 2013

(65) Prior Publication Data

US 2013/0200898 A1   Aug. 8, 2013

(30) Foreign Application Priority Data

Feb. 7, 2012   (DE) .......................... 10 2012 201 770

(51) Int. Cl.
| | |
|---|---|
| *G01V 3/00* | (2006.01) |
| *G01R 33/54* | (2006.01) |
| *G01R 33/36* | (2006.01) |
| *H03K 5/01* | (2006.01) |

(52) U.S. Cl.
CPC ............ *G01R 33/54* (2013.01); *G01R 33/3607* (2013.01); *H03K 5/01* (2013.01)

(58) Field of Classification Search
CPC ..................................................... G01R 33/32
USPC ......................................... 324/322, 318, 314
See application file for complete search history.

(56) References Cited

U.S. PATENT DOCUMENTS

| | | | | |
|---|---|---|---|---|
| 3,970,946 A | * | 7/1976 | Matsuo ..................... | H03D 5/00 |
| | | | | 329/309 |
| 4,761,613 A | * | 8/1988 | Hinks ................ | G01R 33/5676 |
| | | | | 324/307 |

(Continued)

FOREIGN PATENT DOCUMENTS

| | | |
|---|---|---|
| DE | 10 254 660 B4 | 4/2006 |
| DE | 10 2007 058 872 A1 | 4/2009 |

OTHER PUBLICATIONS

German Office Action dated Aug. 22, 2012 for corresponding German Patent Application No. DE 10 2012 201 770.4 with English translation.

*Primary Examiner* — Louis Arana
(74) *Attorney, Agent, or Firm* — Lempia Summerfield Katz LLC

(57) ABSTRACT

A method for digital amplitude control and digital phase control of a high-frequency signal is provided. A digital command signal specifies in complex form, including a real subcomponent and an imaginary subcomponent, an amplitude and a phase of the high-frequency signal that is to be controlled. A digital activation signal is output to a high-frequency unit for the purpose of generating the high-frequency signal. A digital signal deviation value is received in complex form including a real subcomponent and an imaginary subcomponent. The signal deviation value expresses a deviation of the high-frequency signal from the command signal with respect to the amplitude and the phase. The digital activation signal is determined from the command signal while taking into consideration the signal deviation value. The determination of the real subcomponent and the imaginary subcomponent takes place separately in each case.

20 Claims, 4 Drawing Sheets

(56) References Cited

U.S. PATENT DOCUMENTS

| | | |
|---|---|---|
| 6,927,573 B2 | 8/2005 | Eberler et al. |
| 7,728,691 B2 | 6/2010 | Demharter et al. |
| 8,686,728 B2 * | 4/2014 | Stoeckel ............... A61B 5/055 324/318 |
| 2006/0062324 A1 * | 3/2006 | Naito ..................... H04L 27/364 375/296 |
| 2011/0170643 A1 * | 7/2011 | Nagano .............. H03H 17/0264 375/350 |
| 2012/0194296 A1 * | 8/2012 | Unlu ....................... H01P 1/227 333/156 |

* cited by examiner

DIGITAL AMPLITUDE CONTROL AND DIGITAL PHASE CONTROL OF A HIGH-FREQUENCY SIGNAL This application claims the benefit of DE 10 2012 201 770.4, filed on Feb. 7, 2012, which is hereby incorporated by reference.

BACKGROUND

The present embodiments relate to a method for digital amplitude control and digital phase control of a high-frequency signal.

Controlled high-frequency signals are used in a plurality of technical systems. Typical application examples are found, for example, in communications technology and medical technology. In the medical field, for example, modulated high-frequency signals are used in magnetic resonance systems. In order to generate an image using a magnetic resonance tomography method, defined high-frequency pulses are to be irradiated into a body or into a body part of a patient to be examined. The patient is located in a precisely defined magnetic field. The nuclear spins of the atoms in the examination object are thereby excited (e.g., tilted in a defined manner by a flip angle). The resulting emitted signals of the nuclear spins are captured and acquired as raw data, from which the desired magnetic resonance images may be generated. An extremely wide variety of high-frequency pulse sequences may be emitted for various examinations. Each individual high-frequency pulse is to have a precisely defined temporal length, amplitude and shape in order to achieve a specific effect. The parameters used for this purpose may be specified in the form of a digital data stream that is mixed with a mixed frequency MF, thereby ultimately producing the high-frequency signal that has been modulated in the desired manner (e.g., the required series of high-frequency pulses).

High-frequency signals change as a function of the load. The load generates a complex reflection factor, providing that part of the power that is delivered by the amplifier is reflected and phase rotated. For the purpose of control, both the signal from the amplifier to the load and the reflected signal are therefore to be taken into consideration.

The load in a magnetic resonance tomography system is dependent on the patient who is currently being examined and on the body part that is currently being examined. Before starting an examination, adjustment pulses, by which the power required in order to achieve a specified flip angle distribution for the respective examination situation may be specified in advance, may be emitted.

The load situation may change due to movement of the patient during the examination. The behavior of some components may change during the examination period due to temperature effects.

The amplitude and the phase of the high-frequency signal may be controlled during the examination.

DE 102 54 660 B4 describes a method where a feedback signal is demodulated in order to obtain a D.C. voltage signal, by which the amplitude of the high-frequency signal is controlled. A phase comparator is used to obtain a difference signal, using which a phase shifter is activated in order to control the phase of the high-frequency signal.

Digitization of such a method is disadvantageously problematic, as jumps may occur in the range of the phase control and seriously corrupt the control signal.

SUMMARY AND DESCRIPTION

The present embodiments may obviate one or more of the drawbacks or limitations in the related art. For example, a method and a circuit arrangement, by which digital control of a high-frequency signal may be provided without the occurrence of jumps in phase, are provided.

In one embodiment of the method, a digital command signal that specifies in complex form, including a real subcomponent and an imaginary subcomponent, an amplitude and a phase of the high-frequency signal that is to be controlled is provided. The command signal describes the desired high-frequency signal.

Sinusoidal and cosine waves or signals may be represented in complex form as vectors or phasors. In this case, the vector length represents the amplitude of the signal, and the angle made between the vector and a zero axis designates the phase. A sinusoidal wave of constant amplitude may therefore be represented by a uniformly rotating vector. Every complex number may also be expressed by the real subcomponent and the imaginary subcomponent instead of using amplitude and phase.

A digital activation signal is output to a high-frequency unit for the purpose of generating the high-frequency signal. In the simplest case (e.g., without digital control), the activation signal and the command signal are identical. In the method, however, a digital signal deviation value is received in complex form including a real subcomponent and an imaginary subcomponent. The signal deviation value expresses a deviation of the high-frequency signal from the command signal with respect to the amplitude and the phase.

The digital activation signal is determined from the command signal while taking into consideration the received signal deviation value. The real subcomponent of the digital activation signal is determined from the real subcomponent of the command signal and the real subcomponent of the signal deviation value. The imaginary subcomponent of the digital activation signal is determined from the imaginary subcomponent of the command signal and the imaginary subcomponent of the signal deviation value. The determination of the two parts therefore takes place separately.

Analog controls, as disclosed in the prior art, for a high-frequency signal may only take the amplitude into consideration. Controls that also take the phase into consideration using a phase shifter are already known. If this analog control is transferred to a digital control, the jump from a phase angle of 360° to 0° or from 359° to 0° is problematic and may result in rudimentary errors or instabilities. By taking the real subcomponent and the imaginary subcomponent into consideration, this problem does not occur. Digital control of a high-frequency signal becomes possible without the occurrence of jumps in the phase.

A corresponding circuit arrangement includes a command input for receiving a digital command signal that specifies, in a real subcomponent and an imaginary subcomponent, the amplitude and phase of the high-frequency signal that is to be controlled. The command input is therefore to be capable of receiving two separate signals.

The circuit arrangement also includes a signal output for outputting an activation signal to a high-frequency unit for generation of the high-frequency signal, a signal deviation input for receiving a digital signal deviation value, the digital signal deviation value being transferred in the form of a real subcomponent and an imaginary subcomponent, and a determination unit for determining the activation signal from the command signal while taking into consideration the signal deviation value.

The signal deviation value is determined by a comparison between the signal that is actually output by the high-frequency unit and the command signal. The comparison advantageously takes place separately for the real subcomponent and the imaginary subcomponent.

The determination unit is embodied such that determination of the real subcomponent of the activation signal takes place separately from the determination of the imaginary subcomponent of the activation signal.

In one embodiment, a characteristic curve correction takes place before the output of the digital activation signal. For this purpose, the amplitude of the activation signal is calculated from the real subcomponent and the imaginary subcomponent of the digital activation signal. As explained above, the amplitude in the vector model is given by the length of the vector and is therefore calculated as a square root of the sum of the real subcomponent squared and the imaginary subcomponent squared. Depending on the amplitude determined, the activation signal is complex multiplied by a specific correction factor from a plurality of complex correction factors. In one embodiment, the signal deviation that is to be corrected may be reduced in advance.

The advantageous characteristic curve correction may be developed by storing the plurality of complex correction factors in a table and taking a nonlinear characteristic curve of a subsequent high-frequency amplifier into consideration. An oscillator, a mixer and a high-frequency power amplifier (e.g., radio frequency power amplifier (RFPA)) may be included after digital-to-analog conversion in the high-frequency unit that is activated. Amplifiers are known to have an approximately linear dynamic range initially, and a nonlinear characteristic curve as the power limit is approached. By virtue of the characteristic curve correction, the high-frequency power amplifier may be operated up to the power limit. This is advantageous because high-frequency amplifiers may represent the limiting components in high-frequency sections.

The amplitude of the command signal may be normalized to a value of "1", such that the value "1" corresponds to the highest expected command amplitude.

The digital control of a high-frequency signal provides very fast signal processing. Fast processing may be achieved by the selection of suitable hardware. Therefore, the circuit may be implemented in a field-programmable gate array (FPGA).

Further acceleration may be achieved by using fixed-point arithmetic. This has the effect of limiting the value range. Normalization of the input value of the digital control (e.g., the amplitude of the command signal) results in optimal utilization of the value range. If the amplitude is a complex number (e.g., the vector length is limited to "1"), neither the real subcomponent nor the imaginary subcomponent may then exceed An activation signal having an amplitude that is also normalized to the value "1" may correspond to the normalized command signal having the value "1". A digital-to-analog converter that receives the activation signal may likewise be used in an optimal range.

In a development, the normalized activation signal having the value "1" corresponds to an output signal of a subsequent high-frequency amplifier at maximal amplitude. The high-frequency amplifier is therefore operated at the power limit in the event of the highest expected activation amplitude, and the power range of the high-frequency amplifier is fully utilized.

In one embodiment, the high-frequency signal is a pulse sequence, for example, for activating an antenna arrangement of a magnetic resonance tomography system. The antenna arrangement may be a body coil, for example, a local transmit coil arrangement, or a combination of both. The amplitude of the activation signal may be normalized to a value "1" that corresponds to an output signal of a subsequent high-frequency amplifier at maximal amplitude. The determination of the digital activation signal from the command signal is effected while also taking into consideration the highest expected command amplitude within a pulse. This consideration makes it possible to prevent a sequence termination due to an excessively high pulse in the sequence.

In one embodiment, the real subcomponent of the signal deviation value is changed as a function of the highest expected real subcomponent of the command signal for the respective pulse at the time, such that the addition of the real subcomponent of the command signal and the real subcomponent of the signal deviation value does not exceed the value "1". The imaginary subcomponent of the signal deviation value is changed as a function of the highest expected imaginary subcomponent of the command signal for the respective pulse at the time, such that the addition of the imaginary subcomponent of the command signal and the imaginary subcomponent of the signal deviation value does not exceed the value "1". The control range is therefore deliberately restricted at the power limit of the subsequent high-frequency amplifier in order to avoid overloading. Such overloading may result in a sequence termination or damage to the amplifier.

The change of the real subcomponent and the imaginary subcomponent of the signal deviation value may be effected such that the amplitude of the digital activation signal does not exceed the value "1". As explained above, the amplitude is calculated as the square root of the sum of the real subcomponent squared and the imaginary subcomponent squared. If both are "1", a value greater than "1" is produced for the amplitude, and therefore, an overload situation is still created. In principle, a hard limit of "1" may be implemented for this case, though it rarely occurs in practice. In the embodiment, the hard limit is avoided by already taking this into consideration when changing the signal deviation value.

In this case, the real subcomponent and/or the imaginary subcomponent of the signal deviation value may be multiplied by a factor in each case, such that a continuous change takes place as a function of the highest expected real subcomponent and/or imaginary subcomponent of the command signal. The factor is determined such that the real subcomponent and/or the imaginary subcomponent of the signal deviation value does not exceed a value of (1—maximal real subcomponent and/or imaginary subcomponent of the command signal)/(square root of 2).

In one embodiment, the real subcomponent and/or the imaginary subcomponent of the signal deviation value may be routed via a controller before the multiplication in each case. The output value of the controllers may be scaled such that a value of "1" is not exceeded.

Alternatively, the real subcomponent and/or the imaginary subcomponent of the signal deviation value may be changed only if the value "1" for the sum of the imaginary subcomponent of the command signal and the imaginary subcomponent of the signal deviation value, or for the sum of the real subcomponent of the command signal and the real subcomponent of the signal deviation value would otherwise be exceeded, and/or if the value "1" for the amplitude of the digital activation signal would otherwise be exceeded. Therefore, a continuous change of the signal deviation value using a factor does not take place, and a hard limit is applied instead. This has the advantage that the control is not affected in regions that are not close to the power limit of the high-frequency amplifier. However, the control is changed abruptly in the case of pulse sequences having amplitudes close to the power limit.

The real subcomponent and the imaginary subcomponent of the signal deviation value may be routed via a controller before the possible change in each case. The controller may be a proportional-integral controller, for example. The use of a controller for the signal deviation value results in a stabilization of the control response of the digital control.

The circuit arrangement may be located in a magnetic resonance tomography system. Load changes during an examination (e.g., due to a movement of the patient or due to temperature effects in the high-frequency unit or, more generally, in the entire high-frequency section) may result in a sequence termination. The patient then has to undergo a whole new examination. A sequence termination is avoided by virtue of the digital control.

BRIEF DESCRIPTION OF THE DRAWINGS

Identical components are denoted by identical reference numerals in the various figures.

DETAILED DESCRIPTION OF THE DRAWINGS

Figure 1:
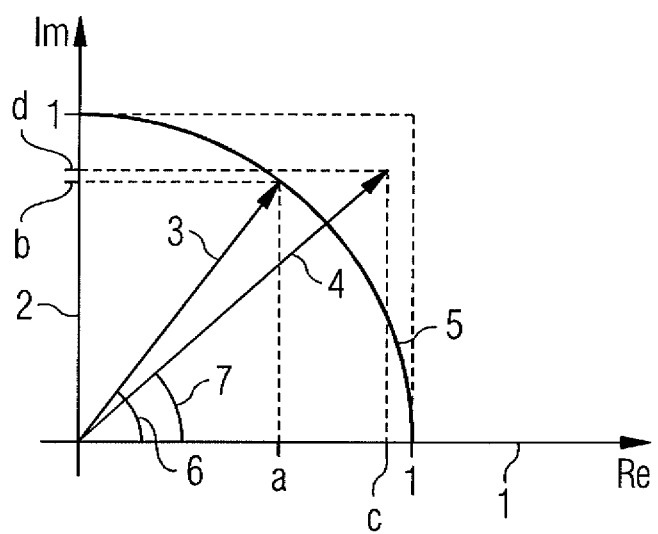
FIG. 1 shows a diagram explaining the signal representation in complex form.

Since the representation of an electrical signal in complex form is to be understood, the relationship between magnitude, phase, real subcomponent and imaginary subcomponent of a vector is briefly explained with reference to FIG. 1. FIG. 1 shows a Gaussian plane including an x-axis or real axis 1, on which a real subcomponent is plotted, and a y-axis or imaginary axis 2, on which an imaginary subcomponent is plotted. Two vectors 3 and 4 are drawn in by way of example. In this case, the length of the vectors 3, 4 represents the amplitude of the signal, which may be the current, the voltage or the power of a low-frequency or high-frequency signal. Angles 6 and 7 enclosed by the respective vectors and the real axis 1 specify the phase of the signal and are therefore an expression of the time sequence. A person skilled in the art knows that a uniform sinusoidal signal may be represented by a uniformly rotating vector, for example.

Vector 3 has a length of "1", a tip of the vector 3 lying on a unit circle 5 that is described about an origin of the system of coordinates 5. The vector 3 has a real subcomponent a and an imaginary subcomponent b. The vector length 1 equals $\sqrt{(a^2+b^2)}$ in this case. Assuming a constant amplitude, real subcomponent a and imaginary subcomponent b do not take a value greater than "1" even in the context of different angles (e.g., in the waveform). By contrast, the vector 4 has a length 1 >"1". The vector 4 has a real subcomponent c and an imaginary subcomponent d. Both components c and d are less than "1" for the angle 7 shown. Both components may assume values greater then "1" for different angles (e.g., in the waveform). The description of a vector in polar coordinates (e.g., length, angle) is equivalent to the description in Cartesian coordinates (e.g., real part and imaginary part). However, real part and imaginary part change continuously in the case of a rotating movement of the vector, and jumps (e.g., in the phase from 360° to 0°) that are disruptive in the case of digital processing do not occur.

Figure 2:
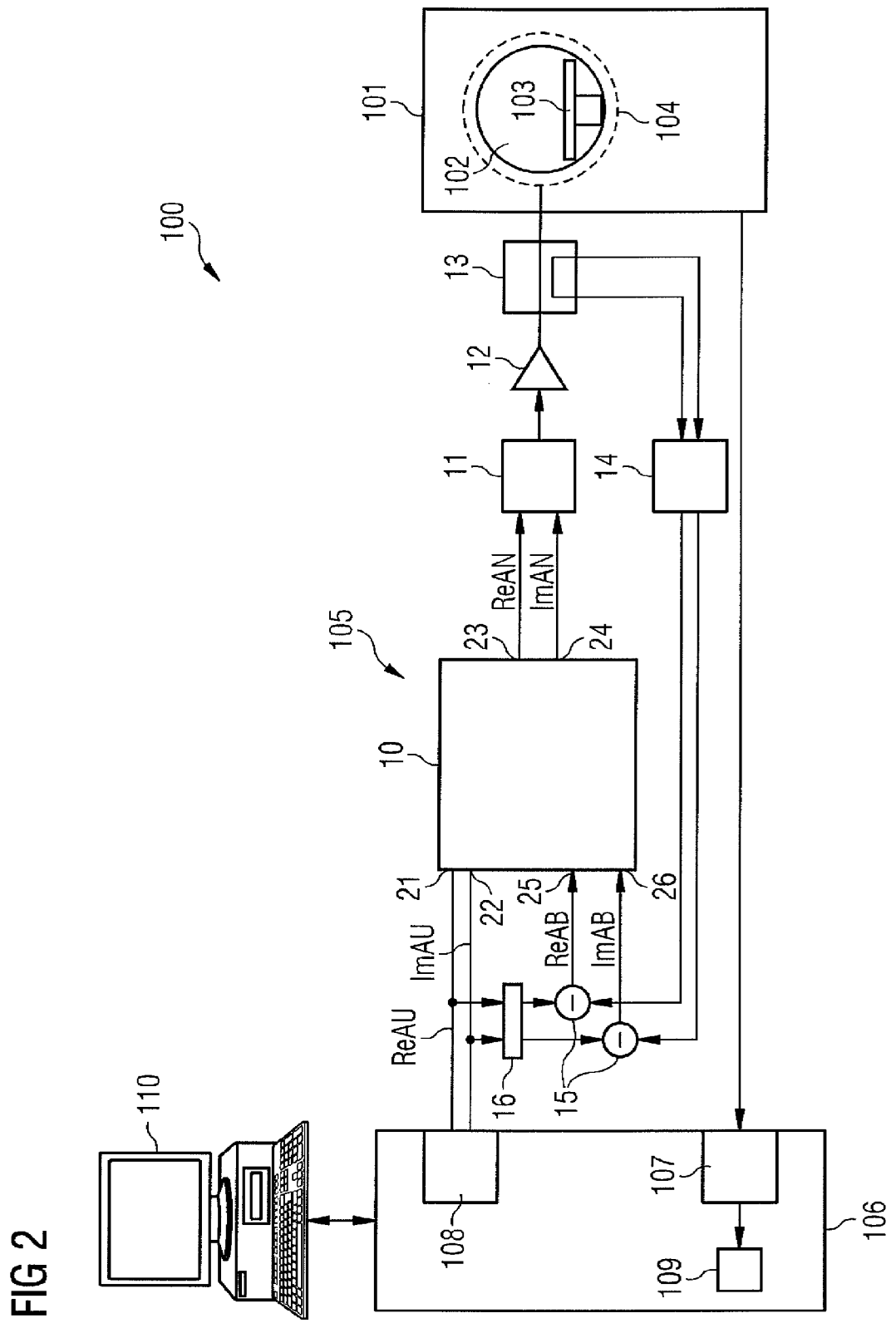
FIG. 2 shows a schematic block diagram of one embodiment of a magnetic resonance tomography system.

FIG. 2 shows a schematic block diagram of one embodiment of a magnetic resonance tomography system 100, in which a circuit arrangement 105 is used.

A central part of the magnetic resonance tomography system 100 is a conventional scanner 101, in which a patient or subject (not shown) may be positioned on a couch 103 in a measurement chamber 102 (e.g., a "patient tunnel") for the purpose of an examination. This scanner has a basic magnetic field system for the purpose of applying a basic magnetic field in the measurement chamber 102, and a gradient coil system, by which a pulse sequence of magnetic field gradient pulses may be output according to a specified measurement record. High-frequency pulses may be emitted in a suitable manner by an antenna arrangement 104 for the purpose of exciting nuclear spins in a region that is to be examined in the examination object. The antenna arrangement 104 may be a body coil as illustrated in FIG. 2, for example, or a local transmit coil arrangement. The antenna arrangement may also pick up the magnetic resonance signals that are produced by a relaxation of the excited nuclear spins. Various antenna arrangements may be used for an examination (e.g., a body coil for emitting the high-frequency pulses and local coils for picking up the magnetic resonance signals).

The scanner 101 is activated by a control device 106 of the magnetic resonance tomography system 100. The control device 106 includes various interfaces. The interfaces include, for example, a high-frequency transmit interface 108 that, as explained in detail below, provides that the desired high-frequency pulses are supplied to the antenna arrangement 104 by a high-frequency section including a circuit arrangement 105. The control device also includes a magnetic resonance signal receive interface 107, by which the magnetic resonance signals from the antenna arrangement that is used for receiving are accepted as raw data, processed and transferred to a reconstruction unit 109. The reconstruction unit 109 reconstructs the image data on the basis of the raw data in the usual manner. Also connected to the control device 106 is a terminal 110, by which an operator may operate the control device 106 and therefore the entire magnetic resonance tomography system 100.

Other components of the scanner 101 (e.g., the gradient coil system, the basic magnetic field system, the couch 103) may be activated by the control device 106 via further interface. However, all of these components are known to a person skilled in the art and therefore are not shown in detail in FIG. 2. The magnetic resonance tomography system may include a plurality of further components (e.g., interfaces to specific networks) that, like the basic functionality of a magnetic resonance tomography system, are known to a person skilled in the art and therefore need no further explanation.

The circuit arrangement 105 in the high-frequency section includes a determination unit 10 that functions digitally, a high-frequency unit including a digital-to-analog converter with mixer 11, and a high-frequency power amplifier 12. A directional coupler 13 allows the decoupling of part of the high-frequency signal travelling to an antenna arrangement (not shown), and the decoupling of part of the high-frequency signal reflected by the antenna arrangement. A demodulation unit 14 is used to convert the decoupled high-frequency signal portions back into baseband signals. Analog-to-digital conversion also takes place in the demodulation unit 14. Two comparators 15 and a delay element 16 are also shown.

The determination unit 10 in FIG. 2 has two inputs 21 and 22 at the top left for receiving a command signal. A real subcomponent ReAU of the command signal is fed into the input 21, and an imaginary subcomponent ImAU of the command signal is fed into the input 22. The command signal is supplied by a control unit (not shown). The command signal includes a low-frequency sequence of pulses of different length and amplitude. The sequence is adapted for a specific examination task.

The determination unit 10 in FIG. 2 has two inputs 25 and 26 at the bottom left for receiving a signal deviation value. A real subcomponent ReAB of the signal deviation value is fed into the input 25, and an imaginary subcomponent ImAB of the signal deviation value is fed into the input 26. The determination unit 10 also has two signal outputs 23 and 24, at which an activation signal for the subsequent high-frequency unit is output. In this case, a real subcomponent ReAN of the activation signal is output at the signal output 23, and an imaginary subcomponent ImAN of the activation signal is output at the signal output 24. If no signal deviation is present, the activation signal may correspond exactly to the command signal.

Conversion of the digital signal into an analog signal takes place in the block 11. In addition, the signal is mixed with a high-frequency signal that is provided by an oscillator (not shown). The mixing may take place before or after the digital-to-analog conversion. The high frequency may be 123 MHz for a magnetic field of 3 Tesla and excitation of H1 atoms. The activation signal therefore forms the envelope curve of a high-frequency signal. The high-frequency signal is delivered to the high-frequency power amplifier 12. In magnetic resonance tomography systems, these amplifiers may be operated up to the power limit depending on the load situation.

The amplified high-frequency signal is directed through the directional coupler 13 to an antenna arrangement 104 of the magnetic resonance tomography system 100 (e.g., the body coil). The directional coupler 13 allows decoupling of the signal in forward and return directions. A load such as the antenna arrangement, for example, may generate a complex reflection factor. Part of the power delivered by the amplifier is reflected and phase rotated. A high-frequency signal includes alternating current components and alternating voltage components (e.g., power components). These may be described in complex form. The decoupled signals from the directional coupler to the demodulation unit 14 therefore include amplitude and phase information, which may also be represented as real subcomponents and imaginary subcomponents. Conversion back into the baseband signal (e.g., the pulse sequence) is effected in the demodulation unit 14. An analog-to-digital conversion also takes place. In the demodulation unit 14, signal processing, in which, for example, information from only the signal in a forward direction, from only the signal in a return direction, or from both signals is taken into consideration for various weightings, may be implemented. For example, the accuracy of the directional coupler may also be improved arithmetically by matrix operations.

The signal is directed from the demodulation unit 14 to the two comparators 15 in a real subcomponent and an imaginary subcomponent. The components are separately compared with the corresponding signal components of the command signal. Before the comparison, the signal components of the command signal are delayed by the delay element 16 in accordance with the signal propagation time of the signals that have been decoupled via the directional coupler. The differences that are calculated by the comparators 15 are supplied as signal deviation values to the determination unit 10. The real subcomponent ReAB of the signal deviation value is fed into the input 25, and the imaginary subcomponent ImAB of the signal deviation value is fed into the input 26.

Figure 3:
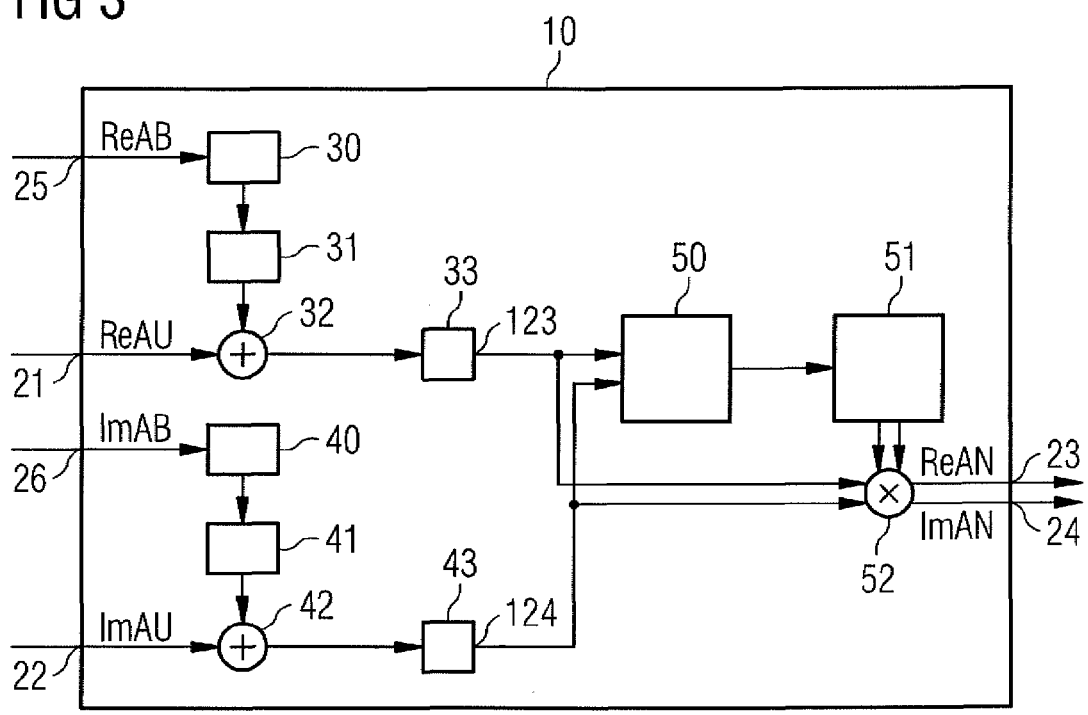
FIG. 3 shows a schematic block diagram of one embodiment of a circuit arrangement.

FIG. 3 shows details of one embodiment of the determination unit 10. Identical reference signs to those in FIG. 2 are used for the same components. In order to explain the structure of the circuit more clearly, the grouping of the inputs is different from that illustrated in FIG. 2. The input 25, into which the real subcomponent ReAB of the signal deviation value is fed, is located at the top on the left-hand side. The input 21, into which the real subcomponent ReAU of the command signal is fed, is shown beneath this. Blocks 30, 31, 32 and 33 are explained in greater detail below and are used to determine the real subcomponent ReAN of the activation signal.

The imaginary subcomponent ImAB of the signal deviation value is fed into the input 26, and the imaginary subcomponent ImAU of the command signal is fed into the input 22. Blocks 40, 41, 42 and 43 are explained in greater detail below and are used to determine the imaginary subcomponent ImAN of the activation signal.

The circuit arrangement according to FIG. 3 within the determination unit 10 includes two controllers 30, 40, two change units 31, 41 for changing the signal deviation value, two adders 32, 42 and two limiters 33, 43. In one embodiment, the outputs 123, 124 of the limiters 33, 43 may be connected directly to the respective outputs 23 and 24 for the purpose of outputting the activation signal. The further blocks 50, 51 and 52 are optional. In block 50, the magnitude (or amplitude) of the activation signal (e.g., die length of the vector) is determined from the real subcomponent and the imaginary subcomponent. Block 51 provides complex correction factors. The activation signal provided at the outputs 123 and 124 is multiplied by the correction factors in the block 52, which may be embodied as a multiplier. Thus corrected, the activation signal is output at the respective outputs 23 and 24.

The determination of the real subcomponent ReAN of the activation signal is analogous to the determination of the imaginary subcomponent ImAN of the activation signal, and the controller 30 corresponds to the controller 40, the change unit 31 corresponds to the change unit 41, the adder 32 corresponds to the adder 42, and the limiter 33 corresponds to the limiter 43. Therefore, the functionality is explained in the following with reference solely to the upper branch for the real subcomponent.

The determination unit 10 is a purely digital unit that is to work very fast. In one embodiment, the determination unit 10 is implemented as a field-programmable gate array (FPGA). Fast signal processing is achieved by using fixed-point arithmetic. The value range is limited to "1". The input value of the digital control (e.g., the amplitude of the command signal) is normalized to "1" in order to provide optimal utilization of the value range in the determination unit 10. In this case, the normalization may relate to the highest activation amplitude permitted by the subsequent high-frequency amplifier. The digital-to-analog converter, which is located between the digital controller and the high-frequency amplifier, is also optimized to a maximal input value of "1". In this context, normalization provides that the value "1" is assigned to the highest actual value. All values are therefore divided by the highest value. If the amplitude of a complex number (e.g., the vector length) is limited to "1", neither the real subcomponent nor the imaginary subcomponent may then exceed "1", as explained above with reference to FIG. 1. The values at the inputs 21 and 22 are therefore less than "1".

The signal deviation value is also normalized (e.g., all signal deviation amplitude values are divided by the highest pulse amplitude value). Likewise, neither the real subcomponent nor the imaginary subcomponent of the signal deviation value should therefore exceed the value "1".

The real subcomponent ReAB of the signal deviation value is fed into the controller 30. The controller 30 may be a proportional-integral controller. Alternatively, a proportional-integral-derivative controller, for example, may be used. A certain smoothing of the signal is achieved by the controller. The output signal of the controller 30 may exceed the value "1". In one embodiment, the change block 31, which is embodied as a hard limiter in the simplest case, is provided. In this case, values greater than "1" are truncated.

Figure 4:
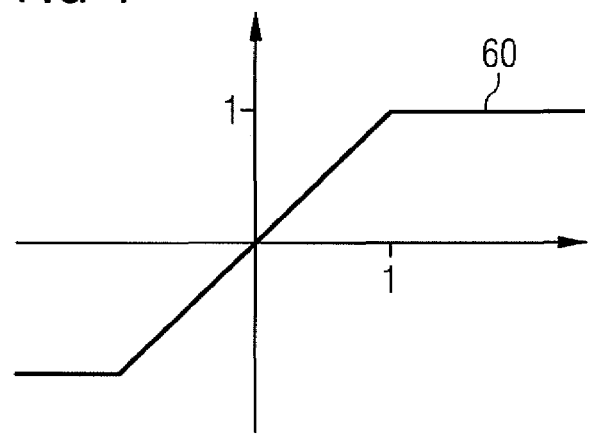
FIG. 4 shows an exemplary characteristic curve of a block of a first embodiment of the circuit arrangement.

An exemplary characteristic curve 60 of such a limiter is shown in FIG. 4. The input values of the limiter are plotted along the x-axis, while the output values are plotted along the y-axis. Input values less than "1" are output unchanged at the output. In the case of input values greater than "1", the output value remains limited to "1". The limiter may be realized as an adder with a saturation of "1".

In the adder 32, the real subcomponent ReAU of the command signal is corrected using the real subcomponent ReAB of the signal deviation value. For example, if the required real subcomponent of the command signal is 0.8, and it is evident from the signal decoupled via the directional coupler 13 that a signal deviation of −0.1 is present in the real part, the real subcomponent of the signal deviation value of 0.1 is added to the real subcomponent of the command signal of 0.8, such that a value of 0.9 is set at the output of the adder 32. The influence of the signal on the high-frequency section is thereby equalized, and control is effected.

The output value of the adder 32 may be greater than "1" (e.g., the value range of fixed-point arithmetic has been exceeded). For example, the real subcomponent ReAU of the command signal may be 0.8 while, in contrast with the example above, the real subcomponent ReAB of the signal deviation value is −0.4. An output value of 1.2 would then be produced. The circuit arrangement according to FIG. 3 therefore includes a limiter 33 that has a characteristic curve 60 and limits the value to "1" again.

In the simplest case, the value at the output 123 of the limiter 33, and likewise the value at the output 124 of the limiter 43, may be delivered directly to the high-frequency unit (e.g., to the block 11 for conversion to an analog high-frequency signal).

In one embodiment that is also illustrated in FIG. 3, the nonlinear characteristic curve of the subsequent high-frequency amplifier 12 is taken into consideration. A pre-emphasis is effected. For this purpose, the amplitude of the activation signal is first determined in the usual form from the real subcomponent and the imaginary subcomponent in a block 50. In mathematical terms, the magnitude of the complex number, as determined by real part and imaginary part, is calculated. In the block 51, complex correction factors are stored in tabular form as a function of the power amplitude and are used to correct the nonlinear characteristic curve of the high-frequency amplifier. Since high-frequency amplifiers are characterized by not insignificant variability, the table is advantageously adapted in each case to the characteristic curve that is measured at the amplifier that is used.

In a multiplier 52, the real subcomponent and the imaginary subcomponent of the activation signal are complex multiplied by the relevant complex correction factor and output to the outputs 23 and 24 as a corrected activation signal.

The control that is described above in the context of an embodiment functions well in most application cases. The control may be provided in cases where the separate correction of the real subcomponent and the imaginary subcomponent results in a complex activation signal that corresponds to the vector 4 in FIG. 1, for example. Although both the real subcomponent and the imaginary subcomponent are less than the value "1", the vector length is greater than "1" (e.g., the activation amplitude exceeds the permissible value for the subsequent high-frequency amplifier).

Figure 5:
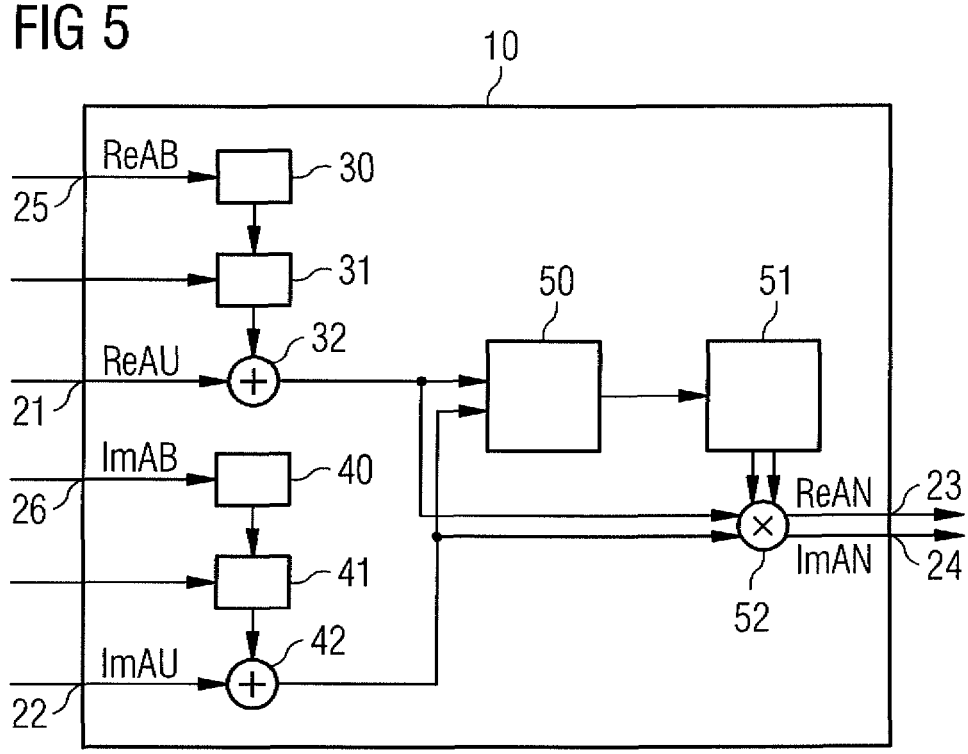
FIG. 5 shows a schematic block diagram of a second embodiment of the circuit arrangement.

The development illustrated in FIG. 5 of the circuit arrangement, as per FIG. 3, is proposed for pulse sequences, for which the command signals have amplitudes close to "1". The circuit arrangement according to this second embodiment differs from the first embodiment in the design of the change units 31 and 41 and in that the limiters 33 and 43 are omitted. Therefore, the structure and functionality of the circuit arrangement in FIG. 5 are not discussed further. The blocks 50, 51 and 52 for characteristic curve correction are also optional in this embodiment.

The change units 31 and 41 are again realized as limiters. A rigid limitation to the value "1" is not imposed, however, and provision is instead made for feeding in a flexible limit. This is indicated in FIG. 5 by an arrow in each case. The limit value is calculated for an individual pulse from the pulse sequence in each case and applies for this pulse. The control unit that supplies the command signals for the pulse sequence may provide the limit value. For the change unit 31, the limitation takes into consideration the highest real subcomponent ReAU of the command signal for the current pulse. The limit value is calculated as (1-maximal real subcomponent)/√2. For the change unit 41, the limitation takes into consideration the highest imaginary subcomponent ImAU of the command signal for the current pulse. The limit value is calculated as (1-maximal imaginary subcomponent)/√2.

Consequently, the output value of the adders 32, 42 does not exceed the value "1", even if the maximal real subcomponent is fed into the input 21, and the maximal imaginary subcomponent is fed into the input. The limiters 33 and 43 may therefore be omitted.

The magnitude of the activation signal may not become greater than "1" due to the factor 1/√2. In practice, the effect of the control is therefore reduced in the case of large pulses. This is beneficial if the subsequent amplifier is operated at a power limit of the subsequent amplifier.

Figure 6:
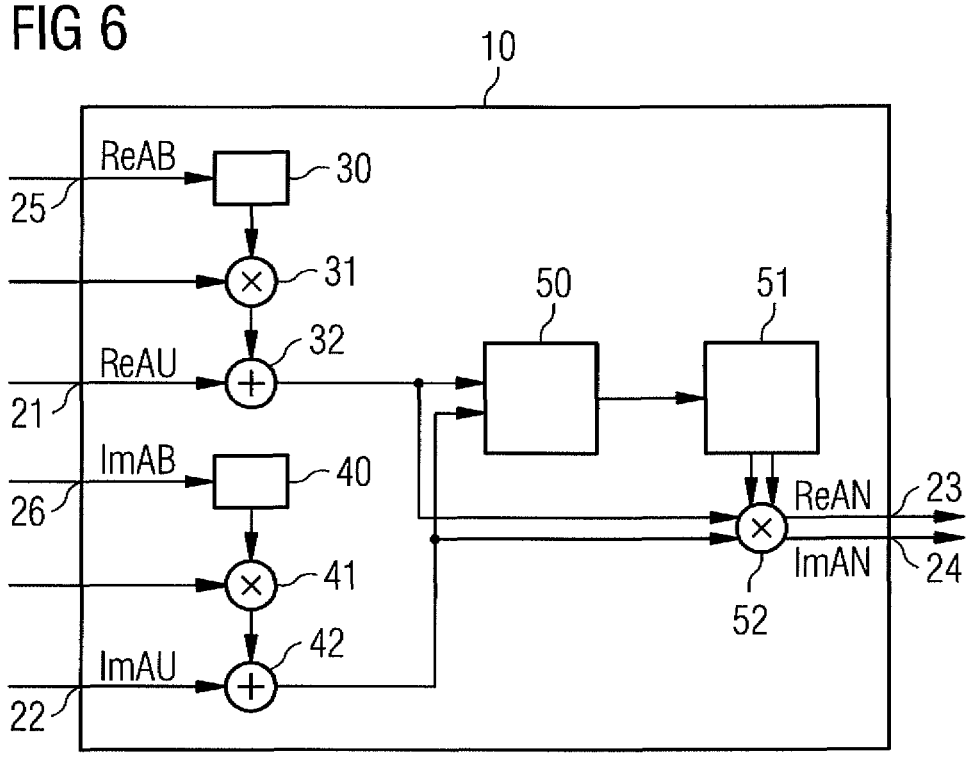
FIG. 6 shows a schematic block diagram of a third embodiment of the circuit arrangement.

FIG. 6 shows a third embodiment of the circuit arrangement. In comparison with the second embodiment, only the change units 31 and 41 are realized differently. In the second embodiment, the highest real subcomponent or the highest imaginary subcomponent of the command signal is taken into consideration for the current pulse. The limit value is again calculated as (1-maximal real/imaginary subcomponent)/√2. In contrast with the second embodiment, the change units 31 and 41 are, however, embodied as multipliers, and the real/imaginary subcomponents of the signal deviation value are multiplied by the limit value. Since the real/imaginary subcomponents of the signal deviation value do not exceed the value "1", the same limitation is achieved with respect to the value that is fed into the adders 32, 42. However, this limitation is achieved by a scaling and not a hard limitation. The influence on the control takes place continuously, but also for smaller values.

The method described in detail above and the illustrated circuit arrangements are exemplary embodiments that may be modified in the widest variety of ways by a person skilled in the art without thereby departing from the scope of the invention. Use of the indefinite article "a" or "an" does not preclude multiple occurrences of the features concerned. Likewise, the term "unit" does not preclude the relevant components from including a plurality of interacting subcomponents, which may also be physically separate if applicable.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for digital amplitude control and digital phase control of a high-frequency signal, the method comprising:
   providing a digital command signal that specifies in complex form, comprising a real subcomponent and an imaginary subcomponent, an amplitude and a phase of the high-frequency signal that is to be controlled;
   outputting a digital activation signal comprising a real subcomponent and an imaginary subcomponent to a high-frequency unit for generating the high-frequency signal;
   receiving a digital signal deviation value in complex form comprising a real subcomponent and an imaginary subcomponent, wherein the digital signal deviation value expresses a deviation of the high-frequency signal from the digital command signal with respect to the amplitude and the phase; and
   determining the digital activation signal from the digital command signal while taking into consideration the digital signal deviation value, wherein the determination of the real subcomponent and the imaginary subcomponent of the digital activation signal occurs separately in each case.

2. The method as claimed in claim 1, further comprising:
   correcting a characteristic curve before the output of the digital activation signal;
   calculating an amplitude of the digital activation signal from the real subcomponent and the imaginary subcomponent of the digital activation signal; and
   complex multiplying, as a function of the amplitude of the digital activation signal, the digital activation signal by a specific correction factor from a plurality of complex correction factors.

3. The method as claimed in claim 2, wherein the plurality of complex correction factors are stored in a table and take into consideration a nonlinear characteristic curve of a subsequent high-frequency amplifier.

4. The method as claimed in claim 1, further comprising normalizing the amplitude of the digital command signal to a value of "1" such that the value "1" corresponds to a highest expected command amplitude.

5. The method as claimed in claim 4, wherein an activation signal having an amplitude that is normalized to the value "1" corresponds to a normalized command signal having the value "1".

6. The method as claimed in claim 5, wherein an output signal of a subsequent high-frequency amplifier at maximal amplitude corresponds to the normalized activation signal having the value "1".

7. The method as claimed in claim 1, wherein the high-frequency signal is a pulse sequence, and an amplitude of the digital activation signal is normalized to a value "1", which corresponds to an output signal of a subsequent high-frequency amplifier at maximal amplitude,
   wherein the digital activation signal is determined from the digital command signal while taking into consideration the digital signal deviation value and while taking into consideration a highest expected command amplitude within a pulse.

8. The method as claimed in claim 1, wherein the high-frequency signal is a pulse sequence, and the real subcomponent of the digital signal deviation value is changed as a function of a highest expected real subcomponent of the digital command signal for the current pulse in each case, such that an addition of the real subcomponent of the digital command signal and the real subcomponent of the digital signal deviation value does not exceed the value "1", and
   wherein the imaginary subcomponent of the digital signal deviation value is changed as a function of a highest expected imaginary subcomponent of the digital command signal for the current pulse in each case, such that an addition of the imaginary subcomponent of the digital command signal and the imaginary subcomponent of the digital signal deviation value does not exceed the value "1".

9. The method as claimed in claim 8, wherein the change of the real subcomponent and the imaginary subcomponent of the digital signal deviation value also takes place such that an amplitude of the digital activation signal does not exceed the value "1".

10. The method as claimed in claim 8, further comprising multiplying the real subcomponent, the imaginary subcomponent, or the real subcomponent and the imaginary subcomponent of the digital signal deviation value by a factor in each case, such that a continuous change of the digital command signal is effected as a function of the highest expected real subcomponent or the highest expected imaginary subcomponent.

11. The method as claimed in claim 10, further comprising:
    routing the real subcomponent and the imaginary subcomponent of the digital signal deviation value via a controller before the multiplication in each case; and
    scaling an output value of the controllers such that a value of "1" is not exceeded.

12. The method as claimed in claim 8, wherein the change of the real subcomponent, the imaginary subcomponent, or the real subcomponent and the imaginary subcomponent of the digital signal deviation value only occurs if the value "1" for the sum of the imaginary subcomponent of the digital command signal and the imaginary subcomponent of the digital signal deviation value, or for the sum of the real subcomponent of the digital command signal and the real subcomponent of the digital signal deviation value would otherwise be exceeded, if the value "1" for the amplitude of the digital activation signal would otherwise be exceeded, or a combination thereof.

13. The method as claimed in claim 12, further comprising routing the real subcomponent and the imaginary subcomponent of the digital signal deviation value via a controller before the possible change in each case.

14. The method as claimed in claim 2, further comprising normalizing the amplitude of the digital command signal to a value of "1" such that the value "1" corresponds to a highest expected command amplitude.

15. The method as claimed in claim 14, wherein an activation signal having an amplitude that is normalized to the value "1" corresponds to a normalized command signal having the value "1".

16. The method as claimed in claim 15, wherein an output signal of a subsequent high-frequency amplifier at maximal amplitude corresponds to the normalized activation signal having the value "1".

17. The method as claimed in claim 2, wherein the high-frequency signal is a pulse sequence, and an amplitude of the digital activation signal is normalized to a value "1", which corresponds to an output signal of a subsequent high-frequency amplifier at maximal amplitude,
  wherein the digital activation signal is determined from the digital command signal while taking into consideration the digital signal deviation value and while taking into consideration a highest expected command amplitude within a pulse.

18. The method as claimed in claim 2, wherein the high-frequency signal is a pulse sequence, and the real subcomponent of the digital signal deviation value is changed as a function of a highest expected real subcomponent of the digital command signal for the current pulse in each case, such that an addition of the real subcomponent of the digital command signal and the real subcomponent of the digital signal deviation value does not exceed the value "1", and
  wherein the imaginary subcomponent of the digital signal deviation value is changed as a function of a highest expected imaginary subcomponent of the digital command signal for the current pulse in each case, such that an addition of the imaginary subcomponent of the digital command signal and the imaginary subcomponent of the digital signal deviation value does not exceed the value "1".

19. A circuit arrangement for digital amplitude control and digital phase control of a high-frequency signal, the circuit arrangement comprising:
  a command input operable to receive a digital command signal that specifies, in a real subcomponent and an imaginary subcomponent, an amplitude and a phase of the high-frequency signal that is to be controlled;
  a signal output operable to output an activation signal comprising a real subcomponent and an imaginary subcomponent to a high-frequency unit for generating the high-frequency signal;
  a signal deviation input operable to receive a digital signal deviation value in the form of a real subcomponent and an imaginary subcomponent, wherein the digital signal deviation value expresses a deviation of the high-frequency signal from the digital command signal with respect to amplitude and phase; and
  a determination unit operable to determine the activation signal from the digital command signal while taking into consideration the digital signal deviation value, wherein the determination of the real subcomponent and the imaginary subcomponent of the activation signal occurs separately in each case.

20. A magnetic resonance tomography system comprising:
  a circuit arrangement for digital amplitude control and digital phase control of a high-frequency signal, the circuit arrangement comprising:
    a command input operable to receive a digital command signal that specifies, in a real subcomponent and an imaginary subcomponent, an amplitude and a phase of the high-frequency signal that is to be controlled;
    a signal output operable to output an activation signal comprising a real subcomponent and an imaginary subcomponent to a high-frequency unit for generating the high-frequency signal;
    a signal deviation input operable to receive a digital signal deviation value in the form of a real subcomponent and an imaginary subcomponent, wherein the digital signal deviation value expresses a deviation of the high-frequency signal from the digital command signal with respect to amplitude and phase; and
    a determination unit operable to determine the activation signal from the digital command signal while taking into consideration the digital signal deviation value, wherein the determination of the real subcomponent and the imaginary subcomponent of the activation signal occurs separately in each case.

* * * * *